United States Patent [19]
Forbes

[11] Patent Number: 5,801,401
[45] Date of Patent: Sep. 1, 1998

[54] FLASH MEMORY WITH MICROCRYSTALLINE SILICON CARBIDE FILM FLOATING GATE

[75] Inventor: Leonard Forbes, Corvallis, Oreg.

[73] Assignee: Micron Technology, Inc., Boise, Id.

[21] Appl. No.: 790,603

[22] Filed: Jan. 29, 1997

[51] Int. Cl.$^6$ ........................................................ H01L 29/00
[52] U.S. Cl. ............................ 257/77; 257/314; 257/321
[58] Field of Search .............................. 257/77, 314, 321

[56] References Cited

U.S. PATENT DOCUMENTS

| | | | |
|---|---|---|---|
| 4,507,673 | 3/1985 | Aoyama et al. | 257/324 |
| 5,021,999 | 6/1991 | Kohda et al. | 365/168 |
| 5,027,171 | 6/1991 | Reedy et al. | 357/23.5 |
| 5,111,430 | 5/1992 | Morie | 365/185 |
| 5,253,196 | 10/1993 | Shimabukuro | 365/45 |
| 5,293,560 | 3/1994 | Harari | 365/185 |
| 5,317,535 | 5/1994 | Talreja et al. | 365/185 |
| 5,388,069 | 2/1995 | Kokubo | 365/185 |
| 5,424,993 | 6/1995 | Lee et al. | 365/218 |
| 5,430,670 | 7/1995 | Rosenthal | 365/45 |
| 5,434,815 | 7/1995 | Smarandoiu et al. | 365/189.01 |
| 5,438,544 | 8/1995 | Makino | 365/185 |
| 5,449,941 | 9/1995 | Yamazaki et al. | 257/321 |
| 5,467,306 | 11/1995 | Kaya et al. | 365/185.2 |
| 5,477,485 | 12/1995 | Bergemont et al. | 365/185.24 |
| 5,485,422 | 1/1996 | Bauer et al. | 365/168 |
| 5,493,140 | 2/1996 | Iguchi | 257/316 |
| 5,508,543 | 4/1996 | Harstein et al. | 257/314 |
| 5,627,781 | 5/1997 | Hayashi et al. | 365/185.2 |
| 5,670,790 | 9/1997 | Katoh et al. | 257/14 |

FOREIGN PATENT DOCUMENTS

| | | |
|---|---|---|
| 3-222367 | 10/1991 | Japan. |
| 6-224431 | 8/1994 | Japan. |
| 6-302828 | 10/1994 | Japan. |
| 8-255878 | 10/1996 | Japan. |

OTHER PUBLICATIONS

Alom, D. et al., "Electrical Properties of Thermal Oxide Grown on N–type 6H–Silicon Carbide", *Appln. Phys. Lett.*, vol. 64, 2845–2846, (1994).

Baldwin, G.L., et al., "The Electronic Conduction Mechanism of Hydrogenated Nanocrystalline Silicon Films", *Proc. 4th Int. Conf. on Solid–State and Int. Circuit Tech, Beijing*, 66–68, (1995).

Bauer, M., "A Multilevel–Cell 32 Mb Flash Memory", *Digest IEEE, Solid–State Circuits Conf.*, 440, (1995).

Boeringer, D.W., et al., "Avalanche amplification of multiple resonant tunneling through parallel silicon microcrystallites", *Physical Rev. B, 51*, 13337–13343, (1995).

Demichelis, F., et al., "Influence of Doping on the Structural and Optoelectronic Properties of Amorphous and Microcrystalline Silicon Carbide", *J. Appl. Phys.*, vol. 72, 1327–1333, (1992).

Demichelis, F., et al., "Physical Properties of Doped and Undoped Microcrystalline SiC:H Deposited By PECVD", *Symp. on Amorphous Silicon Technology*, Anaheim, 413–418, (1991).

Dipert, B., et al., "Flash Memory Goes Mainstream", *IEEE Spectrum, 30*, 48–52, (1993).

Edelberg, E., et al., "Visible Luminescence from Nanocrystalline silicon films produced by plasma enhanced chemical vapor deposition", *Appl. Phys. Lett., 68*, 1415–1417 (1996).

Hamakawa, Y., et al., "Optoelectronics and Photovoltaic Applications of Microcrystalline SiC", *Symp. Materials Issues in Microcrystalline Semi–Conductors*, Boston, 291–302, (1989).

(List continued on next page.)

*Primary Examiner*—Valencia Wallace
*Attorney, Agent, or Firm*—Schwegman, Lundberg, Woessner & Kluth, P.A.

[57] ABSTRACT

A memory is described which has memory cells that store data using hot electron injection. The data is erased through electron tunneling. The memory cells are described as floating gate transistors wherein the floating gate is fabricated using a conductive layer of microcrystalline silicon carbide particles. The microcrystalline silicon carbide particles are in contact such that a charge stored on the floating gate is shared between the particles. The floating gate has a reduced electron affinity to allow for data erase operations using lower voltages.

10 Claims, 3 Drawing Sheets

OTHER PUBLICATIONS

Hu, G., "Will Flash Memory Replace Hard Disk Drive?", *IEEE Electron Devices Meeting, Session 24*, (1994).

Hybertsen, M.S., "Absorption and Emission of Light in Nanoscale Silicon Structures", *Phys. Rev. Lett.*, 72, 1514–1517, (1994).

Jung, T.S., et al., "A 3.3V, 128Mb Multi–Level NAND Flash Memory for Mass Storage Applications", *IEEE*, 512, (1996).

Kamata, T., et al., "Substrate Current Due to Impact Ionization in MOS–FET", *Japan. J. Appl. Phys.*, vol. 15, 1127–1134, (Jun. 1976).

Kato, M., et al., "Read–Disturb Degradation Mechanism due to Electron Trapping in the Tunnel Oxidee for Low–voltage Flash Memories", *IEEE Electron Device Meeting*, 45–48, (1994).

Ohkawa, M., et al., "A 98 mm 3.3V 64Mb Flash memory with FN–NOR type 4–Level Cell", *IEEE*, 512, (1996).

Prendergast, J., "Flash or Dram: Memory Choice for the Future", *IEEE Electron Device Meeting, Session 25*, (1995).

Schoenfeld, O., et al., "Formation of Si Quantam dots in Nanocrystalline silicon", *Proc. 7th Int. Conf. on Modulated Semiconductor Structures, Madrid*, 605–608, (1995).

Shimabukuro, R.L., et al., "Circuitry for Artificial Neural Networks with Non–volatile Analog Memories", *IEEE*, vol. 2, 1217–1220, (1989).

Shimabujkuro, R.L., et al., "Dual–Polarity Nonvolatile MOS Analogue Memory (MAM) Cell for Neural–Type Circuitry", *IEEE*, vol. 24, 1231–1232, (Sep. 15, 1988).

Suh, K.D., et al., "A 3.3 V 32 Mb NAND Flash Memory with Incremental Step Pulse Programming Scheme", *IEEE*, vol. 30, 1149–1156, (Nov. 1995).

Sze, S.M., "Physics of Semiconductor Devices", *Wiley–Interscience 2d Ed.*, New York, 482, (1981).

Takeuchi, K., et al., "A Double–Level–V Select Gate Array Architecture for Multilevel NANAD Flash Memories", *IEEE Journal of Solid–State Circuits*, vol. 31, 602–609, (Apr. 1996).

Tiwari, S., et al., "A silicon nanocrystal based memory", *Appl. Physics Lett.*, 68, 1377–1379, (1996).

Tiwari, S., et al., "Volatile and Non–Volatile Memories in Silicon with Nano–Crystal Storage", *Abstract of IEEE Int. Electron Device Meeting*, 521–524, (1995).

Tsu, R., et al., "Slow Conductance oscillations in nanoscale silicon clusters of quantum dots", *Appl. Phys. Lett.*, 65, 842–844, (1994).

Tsu, R., et al., "Tunneling in Nanoscale Silicon Particles Embedded in an SiO/sub/2 Matrix", *Abstract, IEEE Device Research Conference*, 178–179, (1996).

Ye, Q., et al., "Resonant Tunneling via Microcrystalline–silicon quantum confinement", *Physical Rev. B*, 44, 1806–1811, (1991).

Yih, C.M., et al., "A Consistent Gate and Substrate Current Model for Sub–Micron MOSFET'S by Considering energy Transport", *Int'l Symp. on VLSI Tech., Systems and Applic.*, Taiwan, 127–130, (1995).

Zhao, X., et al., "Nanocrystalline Si: a material contructed by Si quantum dots", *1st Int. Conf. on Low Dimensional Structures and Devices, Singapore*, 467–471, (1995).

FLASH MEMORY WITH MICROCRYSTALLINE SILICON CARBIDE FILM FLOATING GATE

TECHNICAL FIELD OF THE INVENTION

The present invention relates generally to memory circuits and in particular the present invention relates to floating gate memory cells.

BACKGROUND OF THE INVENTION

Non-volatile memory such as electrically programmable read-only memory (EPROM) and electrically-erasable programmable read-only memory (EEPROM) are extensively used for storing data in computer systems. EPROM and EEPROM comprise a large number of memory cells having electrically isolated gates, referred to as floating gates. Data is stored in the memory cells in the form of charge on the floating gates. Charge is transported to or removed from the floating gates by program and erase operations, respectively.

Another type of non-volatile memory is flash memory. Flash memory is a derivative of EPROM and EEPROM. Although flash memory shares many characteristics with EPROM and EEPROM, the current generation of flash memory differs in that erase operations are done in blocks.

A typical flash memory comprises a memory array which includes a large number of memory cells arranged in row and column fashion. Each of the memory cells include a floating gate field-effect transistor capable of holding a charge. The cells are usually grouped into blocks. Each of the cells within a block can be electrically programmed in a random basis by charging the floating gate. The charge can be removed from the floating gate by a block erase operation. The data in a cell is determined by the presence or absence of the charge in the floating gate.

Flash memories have the potential of replacing hard storage disk drives in computer systems. The advantages would be replacing a complex and delicate mechanical system with a rugged and easily portable small solid-state non-volatile memory system. There is also the possibilities that given their very high potential densities that given more speed of operation particularity in the erase operation that flash memories might be used to replace DRAMs. Flash memories might then have the ability to fill all memory needs in future computer systems.

One flash memory is described in S. Tiwari et al., "Volatile and Non-volatile Memories in Silicon with Nano-Crystal Storage," Abstr. of IEEE Int. Electron Device Meeting, pp. 521–524 (1995), which uses confined nano-crystal particles in a floating gate memory cell. The individual nano-crystals are not in electrical contact with each other, and therefore cannot share a common charge. As referred to in the art, the memory has a thin gate oxide and uses a tunnel-tunnel process for writing and reading data. A memory designed to use a tunnel-tunnel process typically has a gate oxide thickness of about 15–20 Å which can be degraded over time resulting in a defective memory.

For the reasons stated above, and for other reasons stated below which will become apparent to those skilled in the art upon reading and understanding the present specification, there is a need in the art for a fast flash memory having a floating gate memory cell which in which the floating gate has a reduced electron affinity, can share a common charge, or does not use a tunnel-tunnel process.

SUMMARY OF THE INVENTION

The above mentioned problems with memory devices and other problems are addressed by the present invention and which will be understood by reading and studying the following specification. A memory cell is described which uses a film of microcrystalline silicon carbide as a floating gate.

In particular, the present invention describes an integrated circuit memory cell comprising a transistor having a source, drain, gate and a floating gate, the floating gate comprising a film of microcrystalline silicon carbide particles. The microcrystalline silicon carbide particles are in contact to form a conductive film.

In another embodiment, an integrated circuit field effect transistor is described. The transistor comprises a conductive channel separating source and drain regions, a floating gate comprising a conductive film of microcrystalline silicon carbide particles. The floating gate is located adjacent the channel and separated therefrom by a first insulating layer. A control gate is provided adjacent the floating gate and separated therefrom by a second insulating layer.

In yet another embodiment, a memory device is described which has an array of memory cells. Each of the memory cells comprise a source region, a drain region, a conductive channel separating the source and drain regions, and a floating gate comprising a conductive film of microcrystalline silicon carbide particles. The floating gate is located adjacent the channel and separated therefrom by a first insulating layer. A control gate is also located adjacent the floating gate and separated therefrom by a second insulating layer. The memory further comprises addressing circuitry for addressing the array of memory cells, and control circuitry for controlling read and write operations of the memory device.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Figure 1:
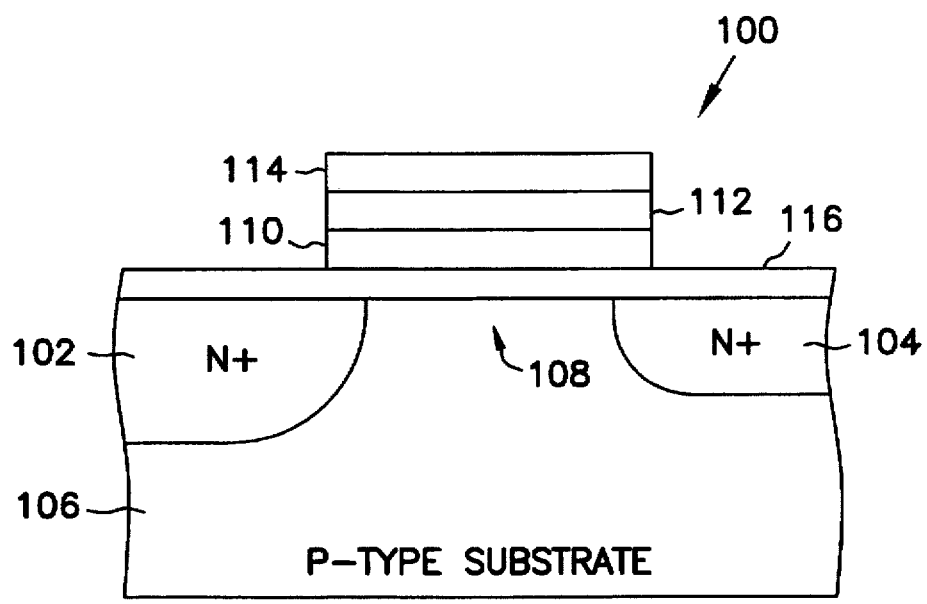
FIG. 1 is a cross-sectional view of a prior art memory cell.

FIG. 1 is a cross-sectional view of a typical memory cell, such as a used in a flash memory. Memory cell 100 comprises a region of a source 102 and a region of a drain 104. Source 102 and drain 104 are constructed from an N+ type of high impurity concentration which are formed in a P-type semiconductor substrate 106 of low impurity concentration. Source 102 and drain 104 are separated by a predetermined space of a channel region 108. Memory 100 further includes a floating gate 110 formed by a first polysilicon (poly) layer, and a control gate 114 formed by a second poly layer. Floating gate 110 is isolated from control gate 114 by an interpoly dielectric layer 112 and from channel region 108 by a thin oxide layer 116 approximately 100 Angstroms (Å) thick.

Figure 2:
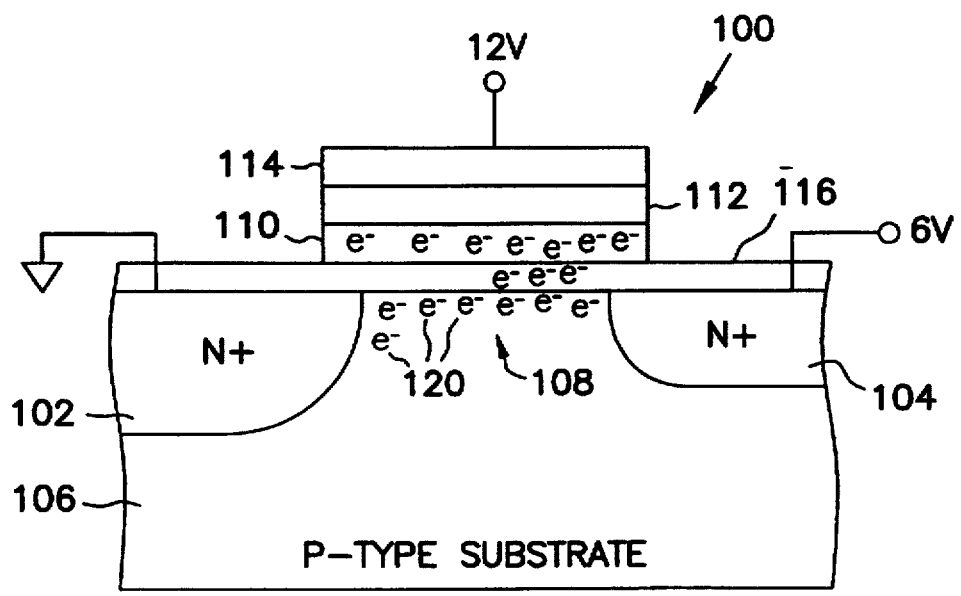
FIG. 2 is the memory cell of FIG. 1 during programming.

FIG. 2 is the memory cell of FIG. 1 during a programming operation. During programming, a positive programming voltage of about 12 volts is applied to control gate 114. This positive programming voltage attracts electrons 120 from P-type substrate 106 and causes them to accumulate at the surface of channel region 108. A voltage on drain 104 is increased to about 6 volts, and the source 102 is connected to ground. As the drain-to-source voltage increases, electrons 120 flow from source 102 to drain 104 via channel region 108. As electrons 120 travel toward drain 104, they acquire substantially large kinetic energy and are referred to as hot electrons.

The voltages at control gate 114 and drain 104 creates an electric field in oxide layer 116, this electric field attracts the hot electrons and accelerates them toward the floating gate 110. At this point, floating gate 110 begins to trap and accumulate the hot electrons and starts a charging process. Gradually, as the charge on the floating gate increases, the electric field in oxide layer 116 decreases and eventually loses it capability of attracting any more of the hot electrons to the floating gate 110. At this point, floating gate 110 is fully charged. The negative charge from the hot electrons collected in the floating gate 110 raises the cell's threshold voltage (Vt) above a logic 1 voltage. When a voltage on control gate 114 is brought to a logic 1 during a read operation, the cell will barely turn on. Sense amplifiers are used in the memory to detect and amplify the state of the memory cell during a read operation. Thus, data is read from a memory cell based upon its "on" characteristics.

Electrons are removed from the floating gate to erase the memory cell. Many memories, including flash memories, use Fowler-Nordheim (FN) tunneling to erase a memory cell. The erase procedure is accomplished by electrically floating the drain, grounding the source, and applying a high negative voltage (−12 volts) to the control gate. This creates an electric field across the gate oxide and forces electrons off of the floating gate which then tunnel through the gate oxide. For a general description of how a flash memory having floating gate memory cells operates see B. Dipert et al., "Flash Memory Goes Mainstream," IEEE Spectrum, pp. 48–52 (October 1993), and incorporated herein by reference.

One of the difficulties with flash memories has been the erase operation using Fowler-Nordheim tunneling. The erase operation requires high voltages, and is relatively slow. Further, an erratic over erase can be induced as a result of the very high erase voltages used. These very high erase voltages are a fundamental problem arising from the high electron affinity of bulk silicon or large grain polysilicon particles used as the floating gate. This creates a very high tunneling barrier. Even with high negative voltages applied to the gate, a large tunneling distance is experienced with a very low tunneling probability for electrons attempting to leave the floating gate. This results in long erase times since the net flux of electrons leaving the gate is low. Thus, the tunneling current discharging the gate is low. In addition, other phenomena result as a consequence of this very high negative voltage. Hole injection into the oxide is experienced which can result in erratic over erase, damage to the gate oxide itself, and the introduction of trapping states.

The solution to these problems is to use a floating gate having a lower electron affinity for electrons. Thus, a lower barrier is provided for electrons to escape over, or through by tunneling. Lower barriers require lower voltages as a result of smaller tunneling distances for the electrons during the erase operation. This results in much faster erase times and much less damage. The possibility of secondary problems occurring in the gate oxide are also reduced, such as electron traps and hole injection.

The present invention describes a transistor using microcrystalline silicon carbide as the floating gate material. Silicon carbide is a wide bandgap material with a bandgap energy of around 2.1 eV. In contrast, silicon has a bandgap energy of 1.2 eV. Silicon carbide also has an electron affinity of around 3.7–3.8 eV, in contrast to the 4.2 eV of silicon. The lower electron affinity is the characteristic which is utilized in flash memories, and is accentuated in microcrystalline samples which have an even lower electron affinity. The use of a lower electron affinity material for the floating gate serves to reduce the barrier at the interface with the tunneling gate oxide, reduce the tunneling distance and greatly increase the tunneling probability.

Figure 3:
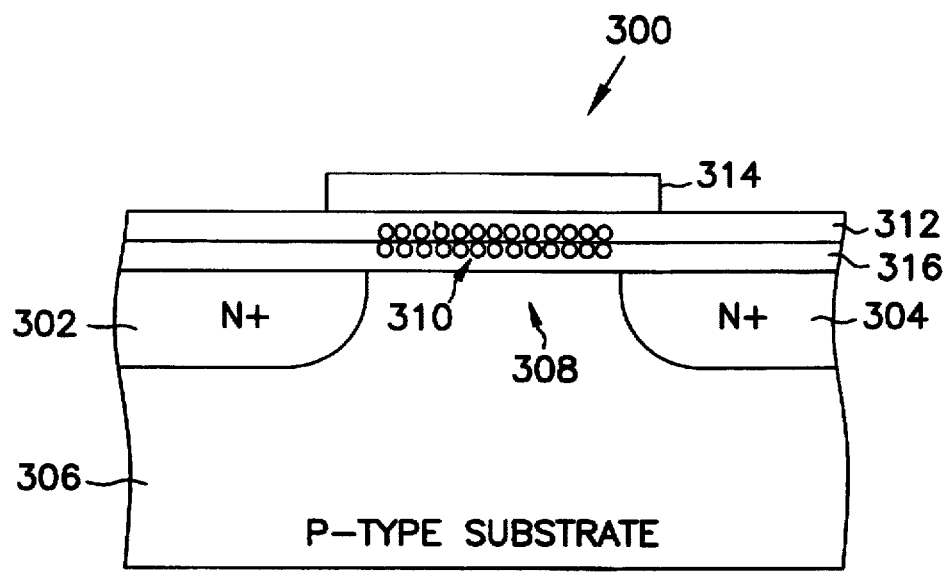
FIG. 3 is a cross-section of a memory cell incorporating a film of microcrystalline silicon carbide as a floating gate.

FIG. 3 shows a cross section of a transistor 300 where the normal polysilicon floating gate has been replaced by a thin film of microcrystalline silicon carbide. Transistor 300 comprises a region of a source 302 and a region of a drain 304. Source 302 and drain 304 are constructed from an N+ type of high impurity concentration which are formed in a P-type semiconductor substrate 306 of low impurity concentration. Source 302 and drain 304 are separated by a predetermined space of a channel region 308. Transistor 300 further includes a floating gate 310 formed as a micocrystalline silicon carbide film. A control gate 314 is formed by a polysilicon layer. Floating gate 310 is isolated from control gate 314 by an interpoly dielectric layer 312 and from channel region 308 by a thin gate oxide layer 316.

Although the particles may not be formed as a uniform sphere, they can be described as having a general diameter of approximately 30 to 100 Angstroms. These films can be deposited by a plasma enhanced chemical vapor deposition (CVD) method or other enhanced CVD techniques known to those skilled in the art. The floating gate can be patterned and etched using standard techniques similar to those used to form the polysilicon floating gates in conventional devices. The microcrystalline silicon carbide particles and film can be doped to have n-type conductivity. The requirements for conductivity are however not great as this film is not used for conductive paths elsewhere in the memory device. Only enough conductivity is required to allow for a redistribution of the carriers within the floating gate.

Using these silicon carbide microcrystals in a conductive film is distinctly different than other techniques of using isolated silicon nanocrystals to observe trapping of single electrons on these isolated crystals, as described above. Here the microcrystals are used as a conductive film to replace the coarse grain polysilicon floating gate structure in a conventional flash memory structured with hot electron injection as the write mechanism and tunneling as the erase mechanism.

Figure 4:
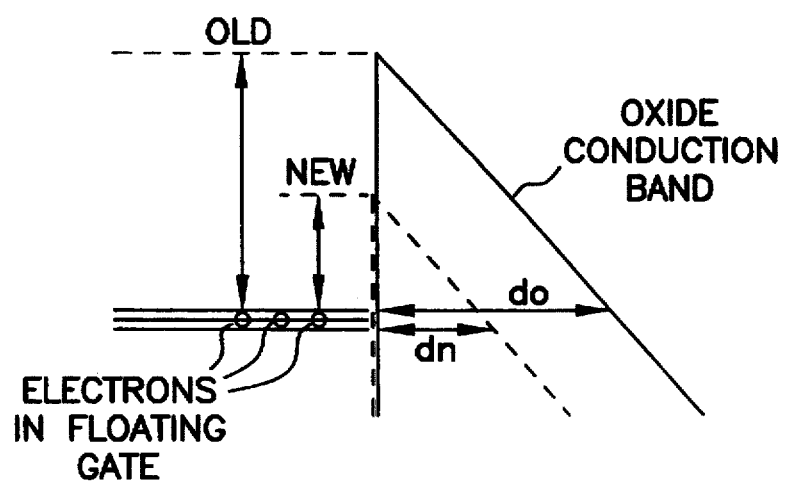
FIG. 4 is a graph of barrier height versus tunneling distance.

FIG. 4 shows how the reduced electron affinity and reduced barrier reduces the distance electrons trapped on the floating gate have to tunnel through during the erase operation to escape from the gate. Tunneling distance "do" represents the tunneling distance experienced in typical transistor having a polysilicon floating gate. Tunneling distance "dn" represents the tunneling distance experienced in a transistor having a floating gate as described in FIG. 3. Even a small reduction in the tunneling distance results in a huge increase in the tunneling probability and current leaving the gate since the tunneling probability is an exponential function of the reciprocal of the tunneling distance. This results in much larger gate discharge currents and much smaller erase time for flash memory devices, or equivalently for the same erase time a huge reduction in voltages and electric fields in the device structure. The result then is a memory cell with a much faster and much easier erase operation due to the lower barrier height for the electrons to tunnel through in leaving the floating gate structures.

Figure 5:
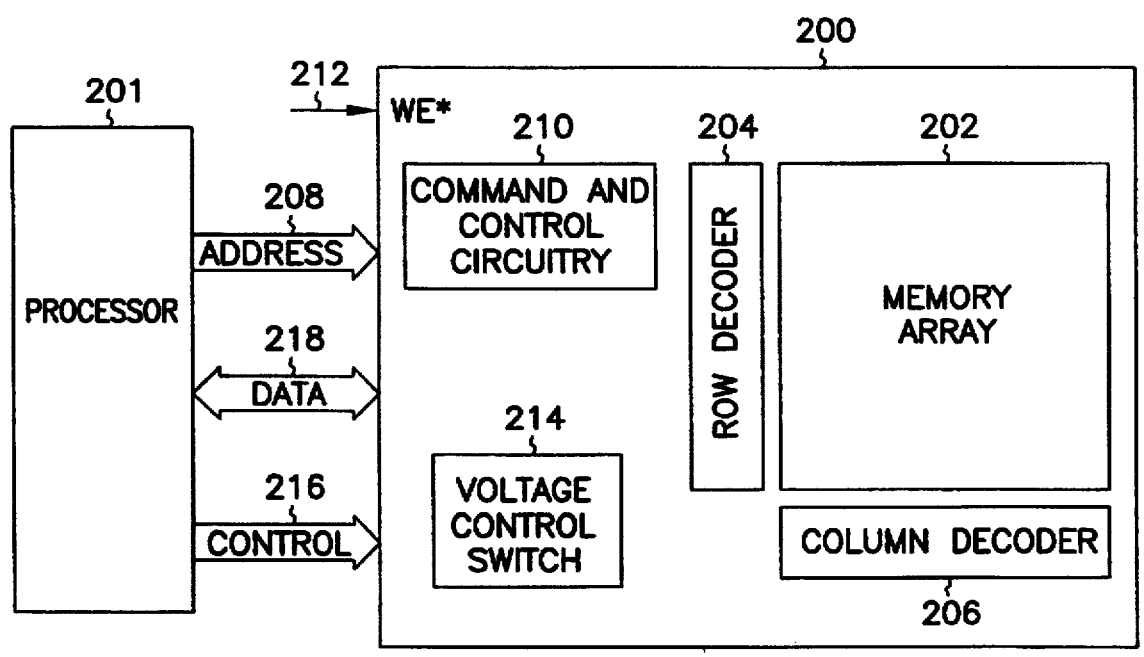
FIG. 5 a simplified block diagram of a typical flash memory incorporating the present invention.

FIG. 5 is a simplified block diagram of a typical system having a flash memory incorporating the present invention. Memory 200 comprises a memory array 202 having memory cells. A row decoder 204 and a column decoder 206 are designed to decode and select addresses provided on address lines 208 to access appropriate memory cells. Command and control circuitry 210 is designed to control the operation of memory 200 in response to incoming command and control signals from a processor 201, including a write enable signal 212 (WE*), control lines 216 and data communication lines 218. Furthermore, a voltage control switch 214 is provided to apply appropriate voltages to the memory cells during programming operation. It will be appreciated by those skilled in the art that the memory of FIG. 5 has been simplified for the purpose of illustrating the present invention and is not intended to be a complete description of a flash memory.

Conclusion

A memory device is described which has fast read, write and erase operations. The memory uses memory cell floating gate transistors with a floating fabricated of a conductive layer of micro-size silicon carbide crystals. Although the floating gate is conductive, it need only be conductive enough to allow for a redistribution of carriers in the floating gate structure itself. The memory cell has a lower electron affinity than conventional memory cells having a floating gate fabricated from polysilicon.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An integrated circuit memory cell comprising:

a transistor having a source, drain, control gate and a floating gate, the floating gate comprising a film of microcrystalline silicon carbide particles, the microcrystalline silicon carbide particles being in contact to form a conductive film.

2. The integrated circuit memory cell of claim 1 wherein the film of microcrystalline silicon carbide comprises a plurality of microscale silicon carbide particles each having a diameter in a range of about 30 to 100 Angstroms.

3. An integrated circuit memory cell comprising:

a transistor having a source, drain, control gate and a floating gate, the floating gate comprising a conductive film of microcrystalline silicon carbide particles.

4. An integrated circuit field effect transistor comprising:

a source region;

a drain region;

a conductive channel separating the source and drain regions;

a floating gate comprising a conductive film of microcrystalline silicon carbide particles, the floating gate located adjacent the channel and separated therefrom by a first insulating layer; and a control gate located adjacent the floating gate and separated therefrom by a second insulating layer.

5. The integrated circuit field effect transistor of claim 4 wherein the film of microcrystalline silicon carbide comprises a plurality of microscale silicon carbide particles each having a diameter in a range of about 30 to 100 Angstroms.

6. The integrated circuit field effect transistor of claim 4 wherein the first and second insulating layers are comprised of oxide.

7. A memory device comprising:

an array of memory cells, each of the memory cells comprising:
a source region,
a drain region coupled to a bit line,
a conductive channel separating the source and drain regions,
a floating gate comprising a conductive film of microcrystalline silicon carbide particles, the floating gate located adjacent the channel and separated therefrom by a first insulating layer, and
a control gate located adjacent the floating gate and separated therefrom by a second insulating layer, the control gate is coupled to a word line;

addressing circuitry for addressing the array of memory cells; and control circuitry for controlling read and write operations of the memory device.

8. The memory device of claim 7 wherein the memory device is a flash memory.

9. The memory device of claim 7 wherein the microcrystalline silicon carbide particles each having a diameter in a range of about 30 to 100 Angstroms.

10. A method of storing data in a flash memory device having an array of memory cells addressable by word and bit lines, comprising the steps of:

increasing a voltage applied to a control gate of a memory cell, the memory cell including a floating gate comprising a conductive film of microcrystalline silicon carbide particles; and trapping electrons on the floating gate by hot electron injection.

* * * * *